(12) United States Patent
Lee

(10) Patent No.: US 7,300,862 B2
(45) Date of Patent: Nov. 27, 2007

(54) METHOD FOR MANUFACTURING SEMICONDUCTOR DEVICE

(75) Inventor: Jae-Suk Lee, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 189 days.

(21) Appl. No.: 11/125,602

(22) Filed: May 9, 2005

(65) Prior Publication Data

US 2005/0255709 A1    Nov. 17, 2005

(30) Foreign Application Priority Data

May 11, 2004 (KR) .................. 10-2004-0032924

(51) Int. Cl.
*H01L 21/44* (2006.01)
(52) U.S. Cl. .............. 438/597; 438/622; 257/E21.627; 257/E21.641
(58) Field of Classification Search .............. 438/597, 438/622; 257/E21.627, E21.641
See application file for complete search history.

(56) References Cited

U.S. PATENT DOCUMENTS 6,147,009 A    11/2000  Grill et al.
2005/0064698 A1*  3/2005  Chang et al. .............. 438/623

* cited by examiner

*Primary Examiner*—Michael Lebentritt
*Assistant Examiner*—Stanetta Isaac
(74) *Attorney, Agent, or Firm*—Andrew D. Fortney

(57) ABSTRACT

High quality dielectric layers may be achieved without introducing excessive impurities when a semiconductor device is manufactured by a method that includes forming a lower wire layer on a structure above a semiconductor substrate, forming a silicon rich oxide layer having a refractive index of 0.45-1.55 on the lower wire layer and the structure, implanting carbon and oxygen (e.g., $CO_2$) into the silicon rich oxide (SRO) layer, and forming an organosilicate glass layer by heat-treating the implanted SRO layer.

20 Claims, 2 Drawing Sheets

METHOD FOR MANUFACTURING SEMICONDUCTOR DEVICE

CROSS-REFERENCE TO RELATED APPLICATION

This application claims priority to and the benefit of Korean Patent Application 10-2004-0032924 filed in the Korean Intellectual Property Office on May 11, 2004, the entire content of which is incorporated herein by reference.

BACKGROUND OF THE INVENTION (a) Field of the Invention

The present invention relates to a method for manufacturing a semiconductor device. More particularly, the present invention relates to a method for forming an organosilicate glass (OSG) that may be used as an interlayer insulating layer in a device that contains copper lines.

(b) Description of the Related Art

Tungsten (W), aluminum (Al), and/or an aluminum alloy are typically used as the metal to form a metal line in a semiconductor device. However, much research is being undertaken on ways to use copper (Cu) in place of tungsten and aluminum for the metal wiring in semiconductor devices because of the relatively low resistivity of copper, and because copper provides a high degree of reliability when used for such an application (i.e., the metal wiring in a semiconductor device).

Nevertheless, a drawback of copper is that, unlike with tungsten and aluminum, it is difficult to form lines in semiconductor devices by reactive ion etching. Accordingly, in order to use copper as the metal for the metal line, an interlayer insulating layer is selectively etched to form a via hole and trench, and then the via hole and trench are filled with copper. Such a process is referred to as a dual damascene process.

When a device uses copper as the metal line, a material having a low dielectric constant is used as an insulating material between copper line layers. An organosilicate glass (OSG) is one example of such a material having a low dielectric constant. OSG is generally made with SiOC, obtained by replacing oxygen (O) with carbon (C) in $SiO_2$.

When a line width of a device is smaller than 10 nm, it is believed that OSG is particularly advantageous. According to one approach, OSG may be formed by plasma enhanced chemical vapor deposition (PECVD) or a spin-on-glass (SOG) method. In this case, a source material used for deposition of the OSG contains excessive carbon and hydrogen. Accordingly, the resultant OSG tends to contain excessive impurities, which may be problematic at times.

Therefore, an improved and/or enhanced method for forming OSG is desired.

The information disclosed in this Background of the Invention section is only for enhancement of understanding of the background of the invention. Therefore, unless explicitly described to the contrary, it should not be taken as an acknowledgement or any form of suggestion that this information may form prior art or other information that is already known in this country to a person of ordinary skill in the art.

SUMMARY OF THE INVENTION

The present invention has been made in an effort to provide a method for forming an OSG that is novel and provides the advantages of a high quality, low dielectric constant insulating layer without introducing excessive impurities.

An exemplary method for manufacturing a semiconductor device according to an embodiment of the present invention includes forming a lower wire layer on a structure above a semiconductor substrate, forming a silicon rich oxide layer having a refractive index of 0.45-1.55 on the lower wire layer and the structure, implanting carbon and oxygen into the silicon rich oxide layer, and heat-treating the implanted silicon rich oxide layer to form an organosilicate glass layer.

The silicon rich oxide layer may have a thickness of 1,000-10,000 Å by plasma enhanced chemical vapor deposition.

The heat-treating may be performed at a temperature of 400-600° C. and/or sequentially in atmospheres comprising $O_2$ gas, $N_2$ gas, and an inert gas.

Before forming the silicon rich oxide layer, a barrier layer may be formed on the lower wire layer and the structure. The barrier layer may comprise SiC having a thickness of 10-3,000 Å by plasma enhanced chemical vapor deposition or metal organic chemical vapor deposition.

The lower wire layer may comprise copper, aluminum, and/or an aluminum alloy.

After forming an organosilicate glass layer, a (dual) damascene process may be applied, that is, a via hole and/or trench may be formed by selectively etching the organosilicate glass layer, and the via hole and/or trench may be filled with copper.

DETAILED DESCRIPTION OF THE PREFERRED EMBODIMENTS

An embodiment of the present invention will hereinafter be described in detail with reference to the accompanying drawings.

Figure 1A:
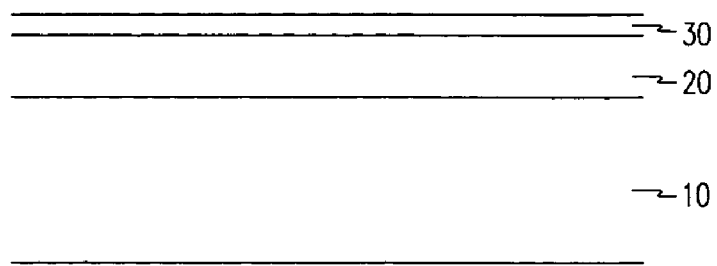
FIG. 1A to FIG. 1C are sectional views illustrating a method for manufacturing a semiconductor device according to an embodiment of the present invention.
Figure 1B:
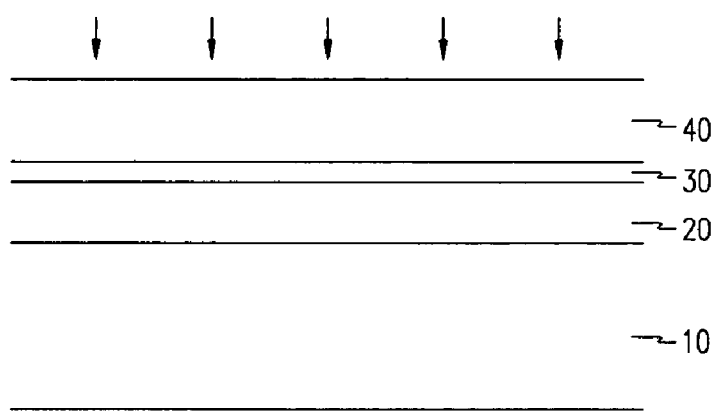
Figure 1C:
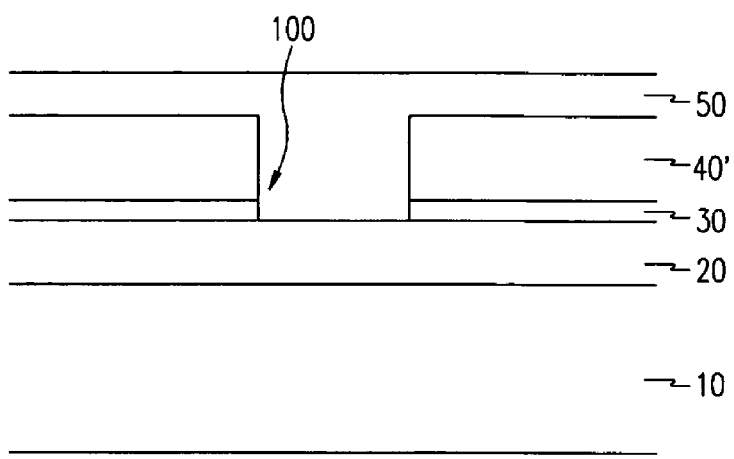

FIG. 1A to FIG. 1C are sectional views illustrating a method for manufacturing a semiconductor device according to an embodiment of the present invention.

Firstly, as shown in FIG. 1A, a lower wire layer 20 is formed on a structure 10 comprising a semiconductor substrate.

In this case, the structure 10 may include a device such as a transistor, comprising a gate oxide layer and a gate electrode formed on the semiconductor substrate, and source and drain regions formed in the substrate. In addition, it may also include a lower insulating layer formed above the individual device.

The lower wire layer 20 may comprise a metal material such as copper, aluminum, or an aluminum alloy. Although not shown in FIG. 1A, when the lower wire layer 20 comprises or consists essentially of aluminum or an aluminum alloy, it may be patterned to a desired width. When the lower wire layer 20 comprises or consists essentially of copper, the trench etched into a lower insulating layer over the device(s) in structure 10 may be patterned to a desired width.

Subsequently, a barrier layer 30 is formed on the lower wire layer 20. After the lower wire layer 20 (or lower insulating layer in structure 10) has been patterned at a required width, the barrier layer 30 may be formed on both of the lower wire layer 20 and the structure 10 of the semiconductor substrate.

The barrier layer 30 generally enhances adhesion of a subsequently formed silicon rich oxide (SRO) layer 40 to the lower wire layer 20, and generally prevents movement of impurities (or otherwise acts as a barrier to diffusion of impurities from SRO layer 40 to the lower wire layer 20, or vice versa). Such a barrier layer 30 is not required in the present invention, and it should be understood to be selectively formed, depending on the case.

The barrier layer 30 may comprise or consist essentially of a SiC material. For example, the SiC may be formed by PECVD or metal organic chemical vapor deposition (MOCVD; e.g., from an organosilicon precursor such as trimethylsilane [$(CH_3)_3SiH$]), and may have a thickness of 10-3,000 Å.

Subsequently, as shown in FIG. 1B, the silicon rich oxide (SRO) layer 40, having a refractive index of 0.45-1.55, is formed on the barrier layer 30. The refractive index of the SRO layer 40 depends on the amount of Si, and accordingly, the amount of Si may be that amount sufficient to achieve a refractive index of 0.45-1.55 for the SRO layer. The SRO layer 40 may be formed by PECVD and/or have a thickness of 1,000-10,000 Å.

Subsequently, the SRO layer 40 is implanted with a carbon and oxygen source material, which may further include sources of silicon, nitrogen and/or hydrogen (e.g., CO, $CO_2$, formic acid, formamide, formaldehyde, methanol, HOCN, silicon cyanate, silicon isocyanate, etc.), generally from above the structure 10. Preferably, however, to reduce or minimize impurities, the SRO layer 40 is implanted with a carbon and oxygen source material that does not include a source of nitrogen and/or hydrogen, particularly hydrogen (e.g., $CO_2$). Thereafter, the implanted SRO layer 40 is heat-treated.

Ion implantation of the carbon and oxygen source material is believed to work as follows. First, C and O ions (e.g., from $CO_2$) are implanted into the SRO layer 40, and the implanted C and O ions bond with broken bonds of the SRO layer 40 caused by the ion implantation. In some cases, O atoms of the SRO are replaced with implanted C ions, and in other cases, implanted C ions simply bond to incompletely bonded Si atoms of the SRO (e.g., implanted C supplements the O atoms bonded to Si atoms that do not have four Si—O bonds). In either case, the element O (from either implanted O ions or replaced/supplemented O atoms in the SRO) bonds with Si atoms or ions (e.g., $Si^+$) of the SRO so as to form a Si—O bond (e.g., as in $SiO_2$), thereby forming an OSG layer 40' (refer to FIG. 1C) comprising or consisting essentially of SiOC, generally without hydrogen impurities.

Furthermore, mobile ions of copper may be captured by Si atoms or ions (e.g., $Si^+$) and/or C atoms or ions (e.g., C+), and the Si (e.g., $Si^+$) suppresses damage that may be caused by fluorine during etching in a dual damascene process, thereby providing a merit of enhancing via characteristics.

Preferably, the implanted SRO layer 40 is heat-treated at a temperature of 400-600° C. In a preferred embodiment, the heat treatment takes place sequentially in atmospheres comprising $O_2$ gas, $N_2$ gas, and an inert or noble gas (e.g., in a first atmosphere comprising or consisting essentially of $O_2$ gas, then in a second atmosphere comprising or consisting essentially of $N_2$ gas, and then in a third atmosphere consisting essentially of an inert or noble gas, such as He, Ne, Ar or Xe). The first and/or second atmospheres may further comprise or consist essentially of a noble gas (such as He, Ne, Ar or Xe).

Subsequently, as shown in FIG. 1C, a damascene process is performed. That is, the OSG layer 40' and the barrier layer 30 are selectively etched to form a via hole 100 (and/or trench, not shown in FIG. 1C), and the wire hole 100 is filled with copper 50.

As described above, according to an embodiment of the present invention, an OSG having a low dielectric constant is formed by a novel process, e.g., by implanting $CO_2$ into an SRO layer and heat-treating the implanted SRO layer. In addition, because an OSG is formed by implanting a carbon and oxygen source material such as $CO_2$ into an SRO layer, the OSC formed by the present invention minimally contains undesired impurities and shows a high quality, in comparison to a conventional method using a source material containing a relatively large amount of carbon and any amount of hydrogen (e.g., a cyclic siloxane).

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a semiconductor device, comprising:
   forming a lower wire layer on a structure above a semiconductor substrate;
   forming a silicon rich oxide layer having a refractive index of 0.45-1.55 on the lower wire layer and the structure;
   implanting carbon and oxygen from a carbon and oxygen source material that does not contain hydrogen into the silicon rich oxide layer; and
   heat-treating the implanted silicon rich oxide layer to form an organosilicate glass layer.

2. The method of claim 1, wherein the carbon and oxygen source material consists essentially of $CO_2$.

3. The method of claim 1, wherein forming the silicon rich oxide layer comprises depositing the silicon rich oxide layer by plasma enhanced chemical vapor deposition.

4. The method of claim 3, wherein the heat-treating is sequentially performed in atmospheres comprising $O_2$ gas, $N_2$ gas, and an inert or noble gas.

5. The method of claim 4, further comprising, before forming the silicon rich oxide layer, forming a barrier layer on the lower wire layer and the structure.

6. The method of claim 5, wherein the barrier layer comprises SiC.

7. The method of claim 1, wherein the heat-treating is performed at a temperature of 400-600° C.

8. The method of claim 7, wherein the heat-treating is sequentially performed in atmospheres comprising $O_2$ gas, $N_2$ gas, and an inert or noble gas.

9. The method of claim 8, further comprising, before forming the silicon rich oxide layer, forming a barrier layer on the lower wire layer and the structure.

10. The method of claim 9, wherein the barrier layer comprises SiC.

11. The method of claim 1, further comprising, before forming the silicon rich oxide layer, forming a barrier layer comprising SiC on the lower wire layer and the structure, wherein:

forming the silicon rich oxide layer comprises depositing the silicon rich oxide layer by plasma enhanced chemical vapor deposition; and the heat-treating comprises heating a chamber containing the substrate to a temperature of 400-600° C. sequentially in atmospheres comprising $O_2$ gas, $N_2$ gas, and an inert or noble gas.

12. A method for manufacturing a semiconductor device, comprising:

forming a lower wire layer on a structure above a semiconductor substrate;

forming a silicon rich oxide layer having a refractive index of 0.45-1.55 on the lower wire layer and the structure;

implanting carbon and oxygen from a carbon and oxygen source material into the silicon rich oxide layer; and heat-treating the implanted silicon rich oxide layer sequentially in atmospheres comprising $O_2$ gas, $N_2$ gas, and an inert or noble gas to form an organosilicate glass layer.

13. The method of claim 12, wherein the carbon and oxygen source material does not contain hydrogen.

14. The method of claim 12, further comprising, before forming the silicon rich oxide layer, forming a barrier layer on the lower wire layer and the structure.

15. The method of claim 14, wherein the barrier layer comprises SiC.

16. A method for manufacturing a semiconductor device, comprising:

forming a lower wire layer on a structure above a semiconductor substrate;

forming a silicon rich oxide layer having a refractive index of 0.45-1.55 on the lower wire layer and the structure;

implanting $CO_2$ into the silicon rich oxide layer; and heat-treating the implanted silicon rich oxide layer to form an organosilicate glass layer.

17. The method of claim 16, wherein the heat-treating is performed at a temperature of 400-600° C.

18. The method of claim 16, wherein the heat-treating is sequentially performed in atmospheres of $O_2$ gas, $N_2$ gas, and an inert or noble gas.

19. The method of claim 16, further comprising, before forming the silicon rich oxide layer, forming a barrier layer on the lower wire layer and the structure.

20. A method for manufacturing a semiconductor device, comprising:

forming a silicon rich oxide layer having a refractive index of 0.45-1.55 on a lower wire layer and a structure above a semiconductor substrate;

implanting carbon and oxygen into the silicon rich oxide layer from a source material that does not contain hydrogen; and heat-treating the implanted silicon rich oxide layer to form an organosilicate glass layer.

* * * * *